United States Patent
Ishida

(10) Patent No.: US 8,421,129 B2
(45) Date of Patent: Apr. 16, 2013

(54) SEMICONDUCTOR DEVICE USING CARBON NANOTUBES FOR A CHANNEL LAYER AND METHOD OF MANUFACTURING THE SAME

(75) Inventor: Masahiko Ishida, Minato-ku (JP)

(73) Assignee: NEC Corporation, Tokyo (JP)

( * ) Notice: Subject to any disclaimer, the term of this patent is extended or adjusted under 35 U.S.C. 154(b) by 57 days.

(21) Appl. No.: 12/595,451

(22) PCT Filed: Apr. 9, 2008

(86) PCT No.: PCT/JP2008/057373
§ 371 (c)(1),
(2), (4) Date: Oct. 9, 2009

(87) PCT Pub. No.: WO2008/129992
PCT Pub. Date: Oct. 30, 2008

(65) Prior Publication Data
US 2010/0108987 A1    May 6, 2010

(30) Foreign Application Priority Data

Apr. 16, 2007 (JP) ................................. 2007-106732

(51) Int. Cl.
*H01L 29/66* (2006.01)
(52) U.S. Cl.
USPC ...... 257/287; 257/288; 257/E51.04; 438/149; 977/742; 977/938
(58) Field of Classification Search ............. 257/E51.04, 257/77, 59, 72, 24, 20, 900, 213, 261, 262, 257/263, 13, 417, 142, 9, E21.403, E51.005, 257/E21.051, E21.049, E29.068, E51.008, 257/902, 49, 368, 288, 365, 287, 341, 342, 257/343, 401; 438/151, 931, 479, 50, 302, 438/FOR. 179, 478, 149, 778, 197; 977/762, 977/949, 742, 938, 743, 700, 712
See application file for complete search history.

(56) References Cited

U.S. PATENT DOCUMENTS

| | | | |
|---|---|---|---|
| 7,301,191 B1* | 11/2007 | Tombler et al. | 257/296 |
| 7,345,296 B2* | 3/2008 | Tombler et al. | 257/9 |
| 2004/0245527 A1* | 12/2004 | Tsukagoshi et al. | 257/77 |
| 2010/0065820 A1* | 3/2010 | Tombler, Jr. | 257/24 |

FOREIGN PATENT DOCUMENTS

| | | |
|---|---|---|
| JP | 2003-017508 A | 1/2003 |
| JP | 2005-093472 A | 4/2005 |
| JP | 2006-190868 A | 7/2006 |
| JP | 2006-278505 A | 10/2006 |
| JP | 2007-012665 A | 1/2007 |
| JP | 2007-031239 A | 2/2007 |

OTHER PUBLICATIONS

Philip G. Collins, et al., "Engineering Carbon Nanotubes and Nanotube Circuits Using Electrical Breakdown", Science, Apr. 27, 2001, pp. 706-709, vol. 292.

Yutaka Ohno, et al., "Photoresponse of Carbon Nanotube Field-Effect Transistors", Japanese Journal of Applied Physics, 2005, pp. 1592-1595, vol. 44, No. 4A.

* cited by examiner

*Primary Examiner* — Thanh Y Tran
(74) *Attorney, Agent, or Firm* — Sughrue Mion, PLLC

(57) ABSTRACT

A CNT channel layer of a transistor is cut along a direction perpendicular to the channel to form a plurality of CNT patches, which are used to connect between a source and a drain. The arrangement of the CNT channel layer formed of a plurality of CNT patches can increase the probability that part of CNT patches becomes a semiconductive CNT patch. Since part of a plurality of CNT patches forming the channel layer is formed of a semiconductive CNT patch, a transistor having a good on/off ratio can be provided.

7 Claims, 6 Drawing Sheets

SEMICONDUCTOR DEVICE USING CARBON NANOTUBES FOR A CHANNEL LAYER AND METHOD OF MANUFACTURING THE SAME

TECHNICAL FIELD

The present invention relates to a semiconductor device and a method of manufacturing the same, and more particularly to a semiconductor device using carbon nanotubes for a channel layer and a method of manufacturing the same.

BACKGROUND ART

There has been examined a semiconductor device using carbon nanotubes (hereinafter referred to as CNTs) for a channel layer. A CNT is a carbon material in which a graphite sheet forms a seamless cylindrical structure. The thickness of a CNT is about 0.7 nm at the minimum, and the length of a CNT is generally in a range of from 1 μm to several tens of micrometers. Some long CNTs have a length greater than 1 mm. CNTs having a thickness of about 5 nm or more exhibit a characteristic of a metal (conductor). Some CNTs having a thickness of 5 nm or less may exhibit a characteristic of a semiconductor depending upon how to wind a graphite sheet (the chirality or the spirality). There has been studied application of those CNTs that exhibit semiconductor characteristics to semiconductor devices.

A CNT has a characteristic of a high electron (hole) mobility (e.g., 1000 $cm^2$/Vs to 10000 $cm^2$/Vs) that exceeds that of silicon, which is currently used for semiconductor devices in general. Such a characteristic is greatly expected to meet demands for a switching device such as a field-effect transistor (FET), particularly a switching device used for an image display device that requires a high speed of response.

Furthermore, a CNT also has advantages in view of a method of manufacturing a semiconductor device. A semiconductor device can be manufactured with use of CNTs by attaching CNTs that have been produced by a bulk growth method, such as a laser abrasion method, an arc plasma method, or a chemical vapor deposition method, to a surface of a substrate. This process does not require a high process temperature. Therefore, a transistor having a high mobility can readily be produced.

The advantage of no need of a high process temperature during a manufacturing process is suitable to meet requirements for thin image display devices in particular. Some of demands in production of an image display device are reduction in weight of the device and flexibility in terms of easiness of bending or rounding. In an active matrix type device, polycrystalline silicon is generally used as TFTs for an active matrix. However, use of polycrystalline silicon requires an annealing process at a high temperature (e.g., at least 300° C.) in order to increase the mobility. Therefore, the process temperature cannot be decreased.

In order to use a plastic substrate, the process temperature should be decreased to 200° C. at the highest, preferably to about 120° C. or less. Therefore, a glass substrate, which is heavy and is likely to be broken, rather than a plastic substrate, has been used as a substrate. Thus, CNTs, which may be almost the only semiconductor material that can be used at a considerably low process temperature, have been expected as a semiconductor material that does not require a high-temperature annealing process.

Furthermore, one of problems in an image display device using active matrix liquid crystal devices or EL cells is suppression of a photo-leakage-current. If light (up to $10^5$ lx) enters silicon TFT portions of pixels from a backlight, a photo-leakage-current increases. In order to suppress the photo-leakage-current, a portion of pixel transistors should be covered with a light-shield film formed of a metal film. However, an aperture ratio is limited by an area of the pixel transistors.

As a result, in the image display device, the limitation on the pixel aperture ratio may cause reduction in variation ranges of the maximum luminance or brightness, or loss of light may cause reduction in energy efficiency. At the same time, addition of a process of producing a metal light-shield film deteriorates a ratio of performance to cost. By contrast, a semiconductor device using CNTs has a characteristic of a remarkably reduced photo-leakage-current as disclosed in *Japanese Journal of Applied Physics*, Vol. 44, No. 4A, p. 1592 (2005). Therefore, CNTs have been expected in view of cost and also as means for solving the problem of a leakage current.

However, when CNTs are applied to a semiconductor device, attention should be paid to the fact that CNTs having a characteristic of a conductor and CNTs having a characteristic of a semiconductor are simultaneously produced in a manufacturing process of those CNTs. In a case where a transistor is produced with use of CNTs produced in the raw, switching characteristics such as a ratio of an on-state current and an off-state current of the transistor (hereinafter abbreviated to an on/off ratio) are problematically deteriorated by a leakage current flowing between a source and a drain (S-D) if there are one or more conductive CNTs.

Therefore, there has been made an attempt to remove conductive CNTs from grown CNTs or an attempt to selectively grow only semiconductive CNTs. However, it is difficult to remove all conductive CNTs in reality. For example, even if conductive CNTs and semiconductive CNTs are to be separated from each other after growth, those CNTs are likely to aggregate due to static electricity or physical adsorption. Additionally, because CNTs have a structure that is very thin and long, it is difficult to separate CNTs once they aggregate.

Furthermore, it is very difficult to separately produce conductive CNTs and semiconductive CNTs during a growth process. For example, even if the grain size of a metal catalyst used for growth of CNTs is made uniform within an error of 0.1 nm, the chirality of a CNT changes and alternates which characteristic the CNT has, i.e., the conductive characteristic or the semiconductive characteristic. Thus, it is difficult to separate conductive CNTs and semiconductive CNTs from each other or to separately produce conductive CNTs and semiconductive CNTs. Therefore, it is desirable to produce a transistor having a high on/off ratio even if a material in which conductive CNTs and semiconductive CNTs are mixed is used to produce a semiconductor device.

As a method of improving the performance of a semiconductor device using CNTs that mixedly include conductive CNTs and semiconductive CNTs, *Science*, Vol. 292 (2001) p. 706, discloses a selectively burning-off method. However, this method requires a considerably greater current flowing for the burning-off process as compared to an operation current of a semiconductor device. Therefore, this method has problems that a large load is imposed on the entire semiconductor device, that it is difficult to obtain stable properties of semiconductor devices individually processed, and that an on-state current of a transistor is reduced by the burning-off process. Accordingly, this method is not practical in the industrial aspect.

Furthermore, the following patent documents relate to a semiconductor device using CNTs. Japanese laid-open patent publication No. 2005-93472 discloses a method of manufacturing a field-effect semiconductor device using carbon nanotubes for a current path which includes a step of preparing a dispersion of carbon nanotubes, a step of attaching the dispersion to a predetermined pattern, and a step of drying the dispersion to form a current path of carbon nanotubes. Japanese laid-open patent publication No. 2005-93472 discloses use of carbon nanotubes having a length ranging from 0.1 µm to 10 µm.

Furthermore, Japanese laid-open patent publications Nos. 2003-17508 and 2007-12665 disclose a field-effect transistor in which a channel layer is formed of a plurality of carbon nanotubes arranged in parallel to a channel. Japanese laid-open patent publication No. 2006-190868 discloses a nonvolatile storage device having a channel layer of carbon nanotubes. However, those prior art documents disclose neither the problems to be solved by the present invention nor the technical concept to solve those problems and thus fail to suggest the present invention.

DISCLOSURE OF INVENTION

Problem(s) to be Solved by the Invention

As described above, conductive CNTs and semiconductive CNTs are mixed in a semiconductor device using CNTs. There is a problem that the switching characteristics are deteriorated if conductive CNTs directly connect between a source and a drain in a transistor.

An object of the present invention is to provide a semiconductor device having good switching characteristics with conductive CNTs mixed therein and a method of manufacturing the same. Another object of the present invention is to provide a semiconductor device which can be formed by a low-temperature process and a method of manufacturing the same.

Means to Solve the Problem(s)

A semiconductor device according to the present invention is characterized by comprising: a source electrode, a drain electrode, and a channel layer provided between the source electrode and the drain electrode, the channel layer being formed of (N+1) carbon nanotube patches (N is a positive integer) each having a size smaller than a channel length in a direction of a channel, the carbon nanotube patches connecting between the source electrode and the drain electrode.

A method of manufacturing a semiconductor device according to the present invention is characterized by comprising: a step of forming a first carbon nanotube film in which carbon nanotubes are dispersed between a source electrode and a drain electrode on a substrate; a step of cutting the first carbon nanotube film perpendicular to a channel direction to form first carbon nanotube patches; a step of forming a second carbon nanotube film between the source electrode and the drain electrode; and a step of cutting the second carbon nanotube film perpendicular to the channel direction to form second carbon nanotube patches so as to fill a gap between the first carbon nanotube patches and a gap between the source electrode and the drain electrode.

Effect(s) of the Invention

According to the present invention, a channel layer of a transistor is formed by using a plurality of CNT patches that have been cut perpendicular to the channel direction. Those CNT patches are overlaid to produce the channel layer. Since the channel layer of the transistor is formed of a plurality of CNT patches, it is possible to increase the probability of semiconductive CNT patches. The channel layer including the semiconductive CNT patches is modulated by a gate electrode to perform an on/off operation. Thus, a transistor having a good on/off ratio can be provided.

BEST MODE FOR CARRYING OUT THE INVENTION

Figure 1:
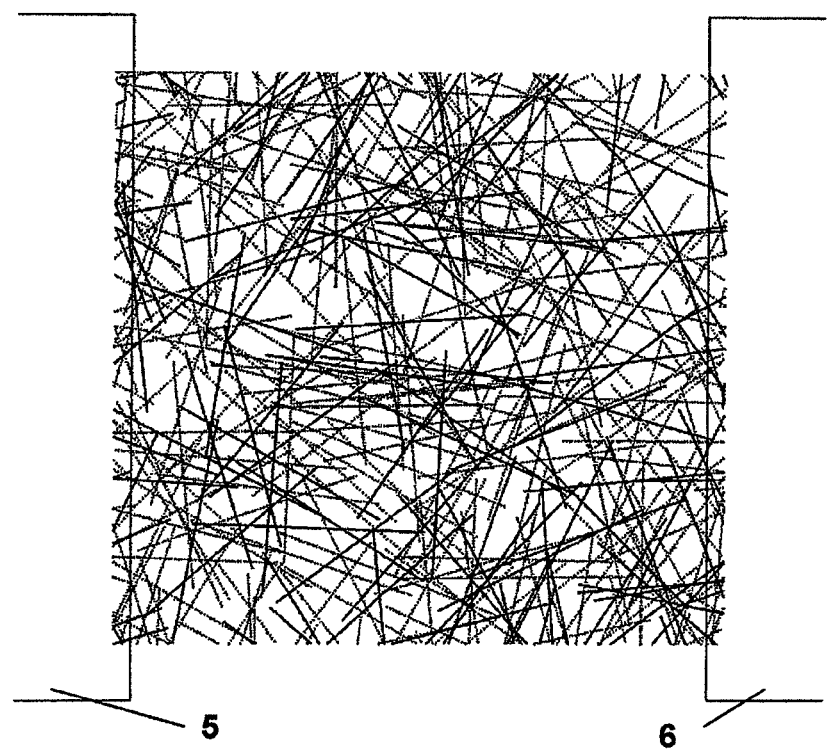
FIG. 1 is a schematic view of a semiconductor device that has not been subjected to a patch process of CNTs.
Figure 2:
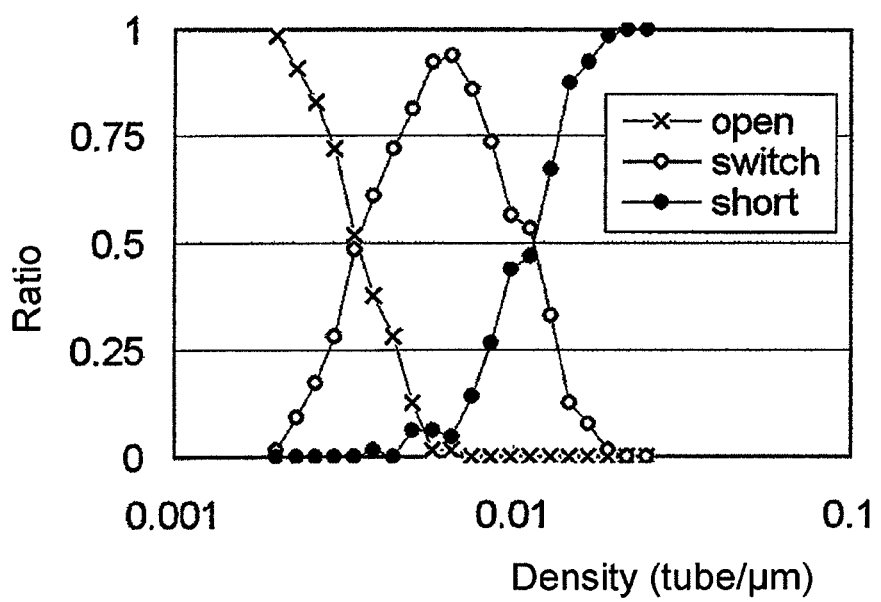
FIG. 2 is a graph showing the CNT density dependency in characteristic distributions of the semiconductor shown in FIG. 1.
Figure 3A:
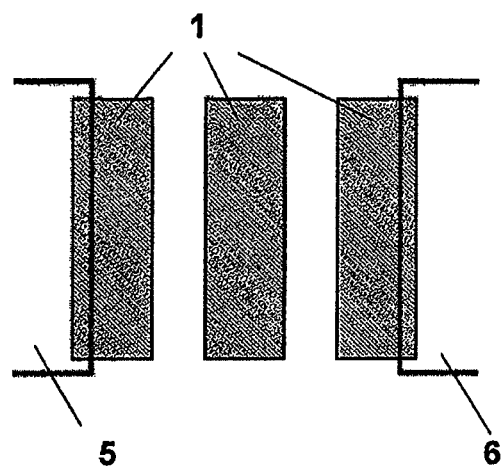
FIGS. 3A and 3B are schematic views of a semiconductor device for explanation of a patch process of CNTs.
Figure 3B:
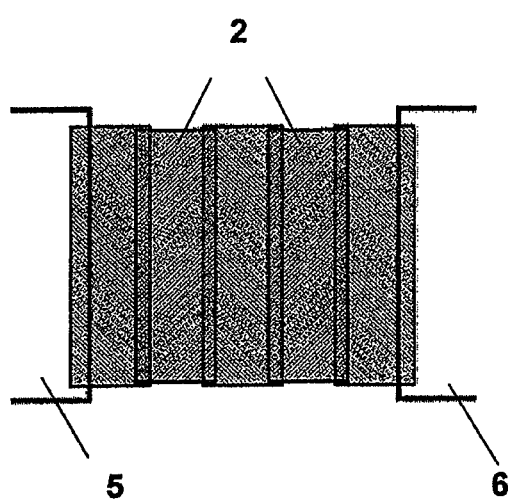
Figure 4:
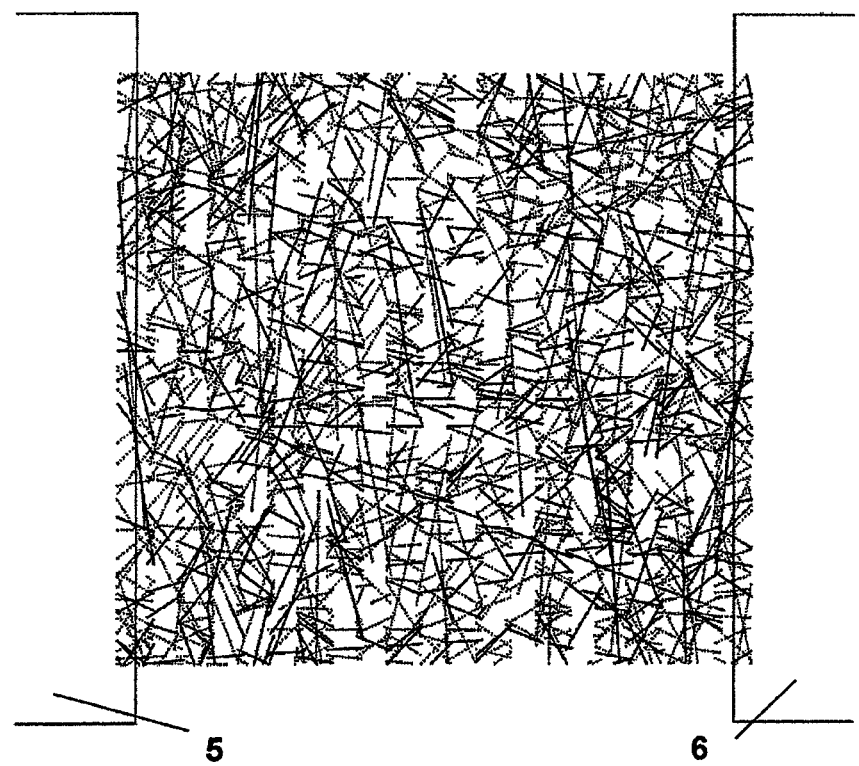
FIG. 4 is a schematic view of a semiconductor device that has been subjected to the patch process of CNTs.
Figure 5:
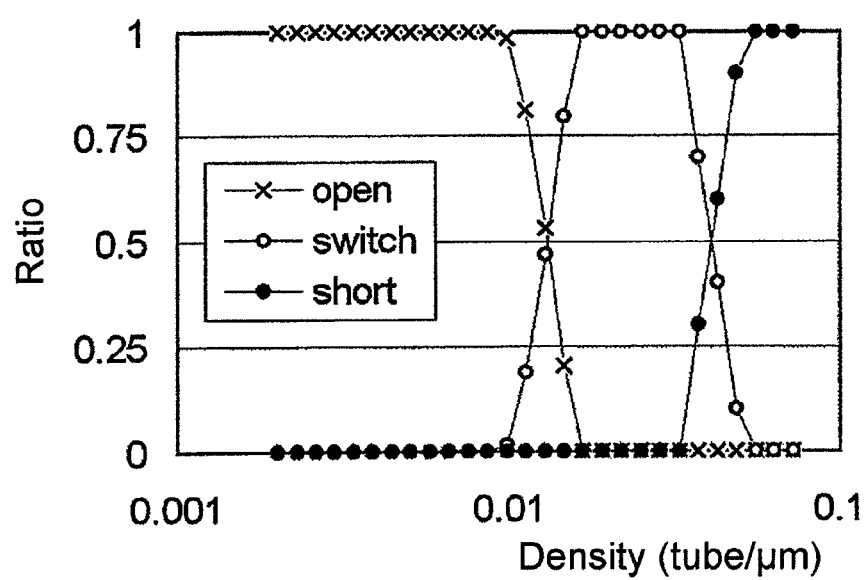
FIG. 5 is a graph showing the CNT density dependency in characteristic distributions of the semiconductor device shown in FIG. 4.
Figure 6:
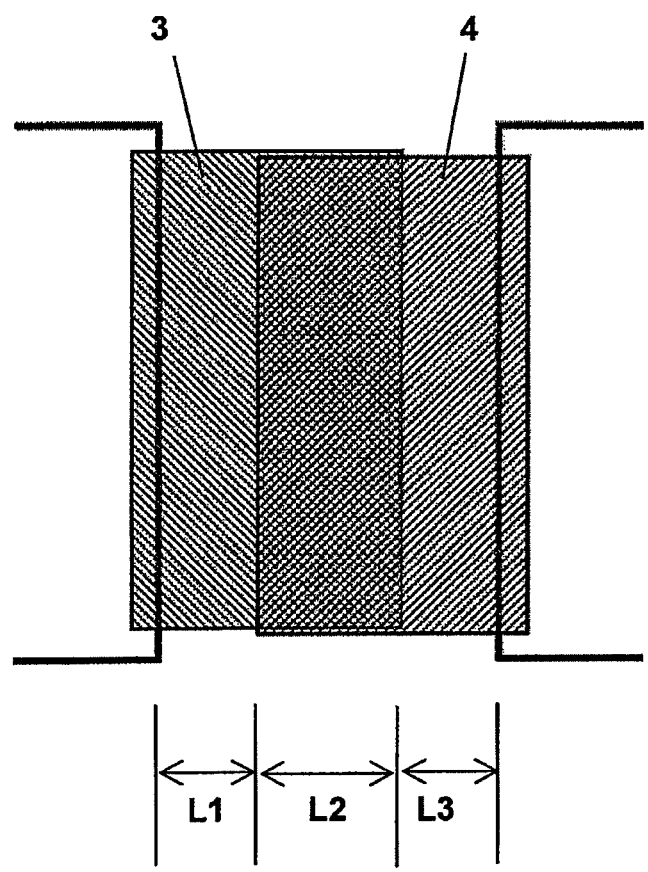
FIG. 6 is a diagram explanatory of a patch structure of CNTs.
Figure 7A:
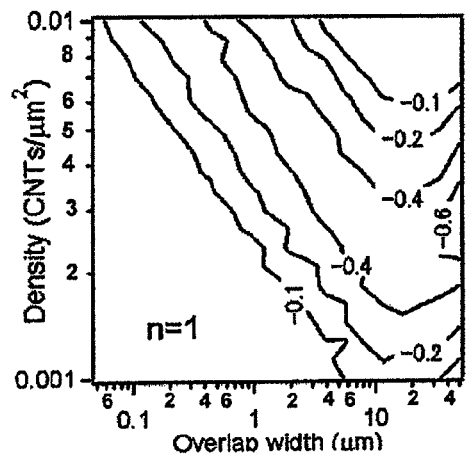
FIGS. 7A, 7B, and 7C are graphs showing a defect ratio to the density of CNTs and the overlap width of patches in which n=1, 5, and 20, respectively, where n is the number of connected patches in a semiconductor device subjected to a patch process of CNTs.
Figure 7B:
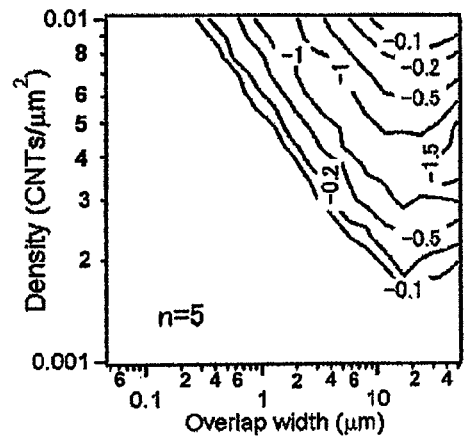
Figure 7C:
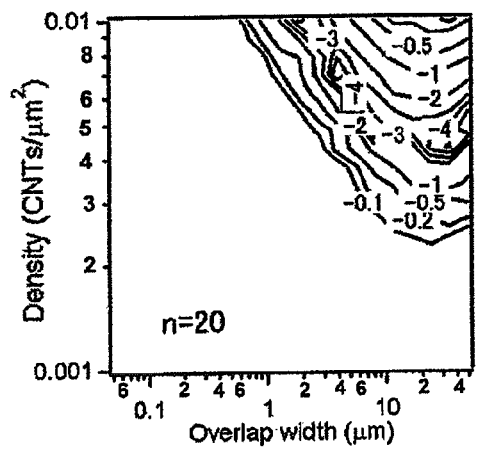
Figure 7D:
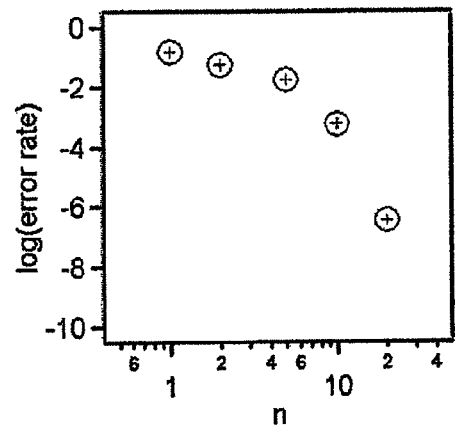
FIG. 7D is a graph showing the relationship between the number of connected patches and a defect ratio of semiconductor devices.
Figure 8A:
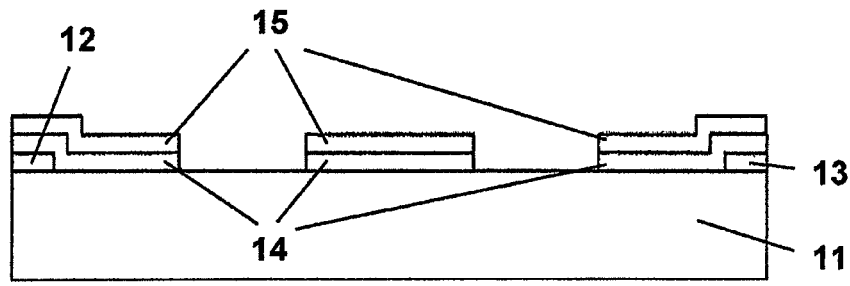
FIGS. 8A, 8B, and 8C are cross-sectional views explanatory of a production process of a semiconductor device subjected to a patch process of CNTs.
Figure 8B:
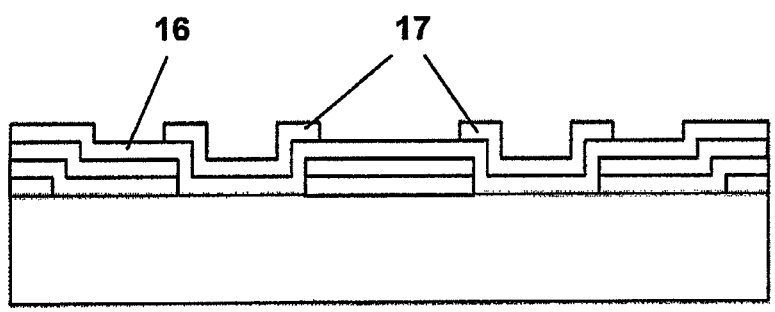
Figure 8C:
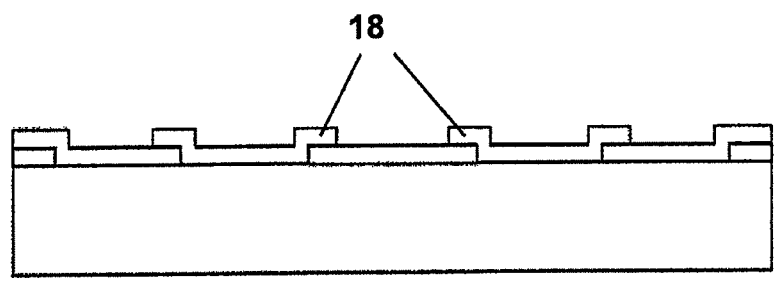

A semiconductor device and a method of manufacturing the same according to the present invention will be described below with reference to the drawings. FIG. 1 is a schematic view of a semiconductor device that has not been subjected to a patch process of CNTs, and FIG. 2 is a graph showing the CNT density dependency in characteristic distributions of the semiconductor shown in FIG. 1. FIGS. 3A and 3B are schematic views of a semiconductor device for explanation of a patch process of CNTs. FIG. 4 is a schematic view of a semiconductor device that has been subjected to the patch process of CNTs, and FIG. 5 is a graph showing the CNT density dependency in characteristic distributions of the semiconductor device shown in FIG. 4. FIG. 6 is a diagram explanatory of a patch structure of CNTs. FIGS. 7A, 7B, and 7C are graphs showing a defect ratio to the density of CNTs and the overlap width of patches in which n=1, 5, and 20, respectively, where n is the number of patches connected. FIG. 7D is a graph showing the relationship between the number of patches connected and a defect ratio of semiconductor devices. FIGS. 8A, 8B, and 8C are cross-sectional views explanatory of a production process of a semiconductor device subjected to a patch process of CNTs.

First, a semiconductor device having a channel layer of CNTs that have not been subjected to a patch process of the CNTs will be described with reference to FIGS. 1 and 2 for comparison with the present invention. Here, the semiconductor device is a transistor. The transistor shown in FIG. 1 has a channel length Lch of 100 µm between a source (S) and a drain (D) (hereinafter abbreviated to S-D) and a channel width Lw of 100 µm.

Linear CNTs having a length Lcnt of 40 µm are arranged as a CNT channel at a density of 0.025 tube/µm. The channel is produced so as to have a width Lw of 100 µm. Hook-shaped areas on opposite ends of FIG. 1 correspond to a source (S) electrode 5 and a drain (D) electrode 6, respectively. In the linear CNTs dispersed between the source and drain electrodes, conductive CNTs are indicated by solid lines, and semiconductive CNTs are indicated by dashed lines. The lengths of Lch, Lw, and Lcnt are assumed examples. The CNTs are illustrated as being linear, unlike actual CNTs.

An important thing to predict the transistor characteristics is the relationship between Lch or Lw and Lcnt and the arrangement and relationship of connections between CNTs and connections between CNTs and electrodes. The above assumption sufficiently meets these requirements. Here, it is important that, because CNTs have a considerably elongated shape, they have such a length that cannot be disregarded with respect to a distance between a source and a drain of a transistor to be produced. Because some CNTs are longer than the distance between the source and the drain, there is a high probability that conductive CNTs directly connects between the source and the drain.

FIG. 2 shows what characteristics an actual transistor exhibited when the density of CNTs was varied in the transistor of FIG. 1. Prediction of the characteristics of the transistor was made by analysis with an electrical circuit simulator. The transistor was analyzed as a network device in which a resistance of the CNTs, contact resistances between the CNTs and between the CNTs and the electrodes, and an on/off ratio of one semiconductive CNT (assumedly 105) were assigned to a random network of the actually dispersed CNTs on a computer.

The horizontal axis of FIG. 2 represents the density of CNTs (tubes/µm) whereas the vertical axis represents a ratio. The graph plotted as "open" represents a ratio of transistors in which no current flowed. The graph plotted as "short" represents a ratio of transistors in which an on/off ratio was lower than $10^2$ and a large leakage current was caused by conductive CNTs. The graph plotted as switch represents a ratio of transistors formed of semiconductive CNTs with good characteristics in which an on/off ratio was not less than $10^2$. Those ratios were plotted by examining characteristics of 64 transistors produced under each condition.

In the case of the transistors shown in FIG. 1, which used CNTs at a density of 0.025 tube/µm for a channel layer, it can be seen from FIG. 2 that nearly 100% of the transistors exhibited the "short" characteristic. In fact, it can be seen from FIG. 1 that some conductive CNTs directly form a bridge between the source and the drain. Thus, since the length of the CNTs is long with respect to the distance between the source and the drain, it can be seen that the probability of the "short" characteristic increases if CNTs are dispersed at a density higher than a certain value.

Furthermore, it can be seen from FIG. 2 that the optimum density was 0.006 tube/µm and that at least 92% of the transistors exhibited the "switch" characteristic. The ratio of the "short" transistors was lowered by decreasing the density from 0.025. However, some "open" transistors, in which no CNTs connected between the source and the drain, were seen when the density was further decreased. Accordingly, with 40-µm CNTs for a channel of 100 µm×100 µm, defective devices are produced at a ratio little lower than 10% even if the conditions are optimized. Thus, it is difficult to use those devices as actual commercial products.

FIGS. 3A and 3B are schematic views of a semiconductor device according to the present invention. According to the present invention, a transistor has a channel layer formed of a CNT film. A CNT film constituted by a CNT network is cut along a direction perpendicular to a channel to produce rectangular CNT patches. A plurality of CNT patches are overlaid to form a channel of the transistor. The probability of semiconductive CNT patches increases when a channel layer is formed of a plurality of CNT patches. Accordingly, the probability that conductive CNTs directly connect between the source and the drain can be reduced even if the density of the CNT film is increased.

As shown in FIG. 3A, rectangular CNT patches 1 are arranged as a first layer on a substrate, on which a source electrode 5 and a drain electrode 6 have been formed, such that the CNT patches do not overlap each other. As shown in FIG. 3A, the CNT patches 1 have been cut along a direction perpendicular to the channel. Furthermore, CNT patches 2, which have been cut in the same manner along the direction perpendicular to the channel, are arranged as a second layer so as to fill up gaps between the patches of the first layer and between the source and drain electrodes (FIG. 3B). Such an arrangement of a plurality of CNT patches in the channel can increase the probability that the rectangular CNT patches are formed of semiconductive CNTs. Since the channel is cut along the direction perpendicular to the channel, the probability that conductive CNTs directly connect between the source and the drain can be reduced.

FIG. 4 shows an example of a transistor in which 21 rectangular CNT patches having a width of 6 µm are arranged in a channel length Lch of 100 µm such that each CNT patch overlaps another CNT patch by 1 µm. In order to reduce a leakage current, it is effective to cut the CNT film perpendicular to a direction connecting the source and the drain to produce CNT patches. FIG. 5 shows ratios of "open" transistors, "short" transistors, and "switch" transistors when the density of the CNT film was varied in patch-type transistors having the arrangement shown in FIG. 4. As compared to the results of no patch process of FIG. 2, transistors having the "switch" characteristic could be obtained at nearly 100% in a considerably wide density range (about 0.016 tube/µm to about 0.033 tube/µm).

An actual CNT patch is a heterogeneous film formed of a finite number of CNTs. Nevertheless, for the sake of convenience, the following discussion assumes that a CNT patch is a homogeneous film that provides conductive ("short") connection, semiconductive ("switch") connection, or insulating connection ("open") with a certain probability. The insulating connection refers to a state in which CNTs do not actually establish connection. It is possible to predict what electric connection will be provided between the source and the drain by the overlap of the patches.

Now is considered what electric connection is provided between a source electrode and a drain electrode in an arrangement as shown in FIG. 6. Areas represented by the lengths L1 and L3 are formed of one CNT patch 3 and one CNT patch 4, respectively. In an area represented by the length L2, two CNT patches of the CNT patch 3 and the CNT patch 4 overlap each other. In order to examine electric connection in the area where the patches overlap each other, it is assumed that the lengths L1 and L3 are zero in the limit and that the density of the CNTs is higher than a certain value. As a result, the electric connection in the areas of L1 and L3 is conductive connection at nearly 100%. Therefore, when only the area of L2 is considered, the probability of conductive connection between the source and the drain is represented by a function $P_M(L2, \rho)$ of the length L2 and the density $\rho$ of the patches. Similarly, the probability of semiconductive connection is represented by $P_S(L2, \rho)$. The probability that no electric connection is established between the source and the drain is represented by $1-P_M-P_S$.

Here, n pairs of source and drain electrodes thus represented are connected in series. Specifically, the number of the CNT patches is n+1, and the number of overlap portions of the patches as connecting points (pairs of source and drain electrodes) is n. In this case, in order to provide semiconductive connection as a whole, all of n electrode pairs should provide conductive or semiconductive connection (there should be no electrode pair providing no connection), and at least one of n electrode pairs should provide semiconductive connection. This probability can be represented by $(P_M+P_S)^n \times (1-P_M^n)$. Because $(P_M+P_S)$ is sufficiently close to 1, this probability approaches 1 as n increases under the conditions that $P_M < P_S$. At that time, a ratio of defects that do not operate correctly can be calculated by the subtraction from 1.

FIGS. 7A, 7B, and 7C show logarithm values of defect ratios $(\log(1-(P_M+P_S)^n \times (1-P_M^n)))$ that were plotted with respect to the density of CNTs and the overlap width of L2 in cases where n=1, 5, and 20, respectively. FIG. 7D is a graph showing how logarithm values (log(error rate)) of the minimum defect ratios varied under respective conditions of n.

It can be seen from those graphs that the minimum defect ratio was lowered as n is increased. When devices are produced under optimum conditions in the case where n=20, a ratio of defective devices is $10^{-6}$ or less. The defect ratio can be lowered by further increasing n. As is apparent from the graphs, the optimum density of CNTs tends to increase when the overlap width of L2 is reduced. Accordingly, it is preferable to reduce the overlap width of L2 if a high CNT density is required to improve the device characteristics such as on-state resistance and mobility.

This relationship reverses if the overlap width of L2 is 20 μm or more. The optimum density tends to increase when the overlap width is increased. However, this phenomenon relates to the length (40 μm) of the CNTs used in the simulation. The value of the overlap width of L2 at which the tendency reverses is decreased when the length of the CNTs is reduced. The value at which the tendency reverses is increased when the length of the CNTs is increased. The optimum conditions for producing devices can be determined with use of this relationship. Furthermore, use of CNTs in which a ratio of semiconductive CNTs has been increased can reduce a ratio of defective devices, improve characteristics such as on-state resistance and mobility, and provide stability.

FIGS. 8A, 8B, and 8C are cross-sectional views schematically showing steps of producing a semiconductor device according to the present invention. An insulating material such as a plastic material, a ceramic material, or a silicon oxide may be used as a substrate 11. A source electrode 12 and a drain electrode 13 are formed in advance on the substrate 11 by using lithography technology or the like. Those electrodes may be produced after production of CNT patches.

A CNT film 14 is formed as a first layer. The CNT film may be prepared by using a method such as laser abrasion, arc discharge, a chemical vapor deposition method (CVD), and a HiPCO (high-pressure carbon monoxide) method. However, the method of preparing the CNT film is not limited to those methods. Other methods may be used as long as they can produce CNTs having good crystallinity. Methods of dispersing CNTs on a surface of the substrate include a method of growing CNTs directly on the substrate with use of a CVD method or the like and a method of attaching a CNT film that has been grown beforehand to the substrate. Because it is necessary to maintain the substrate at a high temperature of at least 500° C. in order to grow CNTs directly on the substrate, it is preferable to use the latter method if a substrate to be used has a low thermal resistance.

Furthermore, there may be used CNTs in which a ratio of semiconductive CNTs has been increased by optimizing growth conditions or performing a refining process. Two-thirds of CNTs, which is the theoretical ratio, are generally semiconductive CNTs. When this value is increased, $P_M$ decreases and $P_S$ increases. Therefore, a defect ratio can further be reduced with ease. Methods of attaching the CNT film to the substrate include a method of blowing or hailing CNTs in a vapor phase and a method of dispersing CNTs in a solvent or the like and attaching the CNTs via a liquid phase. In a state in which CNTs produced by various vapor-phase methods drift in a vapor phase, the CNTs can be induced and attached to a substrate by an air current, an electrostatic force, a light pressure, weight, or the like to prevent the CNTs from being bundled. Therefore, the vapor-phase method is preferable.

In the case where the CNTs are dispersed in a solvent, pieces of CNTs put into the solvent can be dispersed by using an ultrasonic transducer or the like. A CNT film can be attached to the substrate by applying the solution to the substrate. As a method of applying the solution, there may be used a method of directly applying the solution with a brush, a spin coat method, a dip coat method, a spray coat method, a method of dropping a trace of the solution, or the like.

The CNT density of the film to be applied can be controlled by the CNT density of the solution or application conditions such as the number of applications or the speed of application. In the simulation, the density of CNTs is represented by the number of tubes per unit area. When devices are actually produced, the optimum conditions of application can be obtained from a measured value of the intensity of scattered light of a laser light irradiated to the substrate or the intensity of transmitted light in a case where the substrate is transparent, and ratios of the "open," "switch," and "short" characteristics obtained by production of the devices.

Subsequently, a protective film 15 is patterned into shapes of CNT patches produced as shown in FIG. 8A. Organic resin that is insoluble in an organic solvent but is soluble in an alkali solvent, such as a lift-off resist, or a metallic thin film soluble in weak acid or weak alkali may be used for the protective film. For example, it is preferable to use an Al thin film as a mask material because it is highly resistant to various processes and is readily removable by weak alkali.

In the case where organic resin is used, a resist pattern obtained by exposing a photoresist for organic resin patterning is used as a mask, and a window is formed in the organic resin with an alkali solvent. Then only the photoresist is removed by acetone or the like. Thus, an organic resin mask can be produced. This method is very effective because a pattern can sufficiently be maintained when a CNT solution using an organic solvent is applied. In the case where an Al thin film is used, an Al film of 30 nm to 50 nm is similarly patterned with a photoresist. Development of the resist and formation of a window in the Al film are simultaneously performed with an alkali developer for the photoresist. Then only the photoresist is removed, so that an Al mask can be obtained.

While the produced protective film is used as a mask, the CNT film can be removed from an unmasked portion. Depending upon the usage, a method of removing the CNT film can be selected from an oxygen plasma process, a plasma process using other oxidative gases, an ozone process, a sputtering process, a strong acid process, and the like.

Subsequently, a CNT film 16 is applied as a second layer, and a protective film 17 is patterned (FIG. 8B). While the patterned protective film 17 is used as a mask, the CNT film is removed from unnecessary areas. Finally, the protective films 15 and 17 are collectively removed, so that a CNT patch 18 of the second layer can be obtained (FIG. 8C). A method of removing the protective films can properly be selected. For example, the masks of organic resin and Al can be removed effectively by a weak alkali solution such as a developer for a photoresist.

As to a gate electrode for performing modulation of the transistor, a gate insulating film can further be formed on the CNT patches 14 and 18 so that the CNT patches 14 and 18 are covered with the gate insulating film. A gate electrode can be formed on the gate insulating film. Alternatively, a gate electrode covered with a gate insulating film may be preformed on the substrate 11, and devices may be formed thereon. Thus, it is possible to produce a CNT device (transistor) using a CNT film subjected to a patch process for a channel.

As described above, the greatest cause of deterioration of the on/off ratio characteristics in a CNT transistor is a leakage current that flows paths of conductive CNTs. In order to suppress a leakage current, conductive CNTs should not directly connect between the source and the drain, and at least part of the path between the source and the drain should be formed of a semiconductive CNT. If the source and drain electrodes are directly connected to each other only by conductive CNTs, a "short" circuit state is established between the source and the drain so that a leakage current flows. As a result, the on/off characteristics of the transistor are deteriorated. Accordingly, if one CNT is used across the channel length of a transistor, it should inevitably be a semiconductive CNT.

According to the present invention, a CNT channel layer of a transistor is cut perpendicular to a channel direction. A plurality of CNT patches are used to connect between the source and the drain. When a plurality of CNT patches are used to produce a transistor, a "switch" characteristic transistor can be obtained with a probability of nearly 100% in a wide range of the CNT density. Thus, even in a case where conductive CNTs are mixed, the arrangement of a channel layer formed of a plurality of CNT patches cut perpendicular to the channel direction can increase the probability that part of the CNT patches becomes a semiconductive CNT patch in the channel layer. A transistor in which part of a channel layer is formed of a semiconductive CNT patch is modulated by a gate voltage to perform an on/off operation. In this manner, a transistor having a good on/off ratio can be provided. Thus, according to the present invention, there can be provided a semiconductor device with a transistor having a good on/off ratio and a method of manufacturing the same.

Examples

As specific examples of a semiconductor device according to the present invention, a typical method of manufacturing a transistor and characteristics of a transistor produced by such a method will be described below with reference to FIGS. 8A, 8B, and 8C.

First, a polyethylene naphthalate substrate having a thickness of 200 μm was used as the substrate 11. Insulating materials such as other plastic materials, ceramic materials, and silicon oxide may be used as the substrate 11. The source electrode 12 and the drain electrode 13 were formed on the substrate 11 by using optical exposure. A two-layer metallic film of 5-nm titanium and 45-nm gold was used as a material for the electrodes. The first CNT film 14 was formed by an application method. A solution was prepared by putting CNTs of 1 μg produced by a laser abrasion method into a dichloroethane solution of 1 ml and agitating it with a head-type ultrasonic agitator for 10 seconds. The substrate was spin-coated with this solution of 20 μl ten times to thereby form the CNT film 14.

An Al film deposited with a thickness of 30 nm was used as the protective film 15. Optical exposure was used to process the Al film. The substrate with the CNT film that has been covered with the photoresist was subjected to optical exposure using a desired optical mask. Then development was performed for one minute with use of a 2.5% tetramethylammonium hydrate (TMAH) solution, thereby simultaneously etching the Al film and producing the protective film 15. Thereafter, the photoresist was removed with use of acetone. The CNT patches 18 of the second layer were processed in the same manner as described above. Finally, the Al protective film was removed with use of 2.5% TMAH.

In this manner, a CNT patch channel layer in which 21 CNT patches each having a width of 9 μm were arranged as the first layer and the second layer at intervals of 1 μm was formed in a distance of 100 μm between the source and the drain. At that time, n=20. The channel width of the transistor was 100 μm. Furthermore, a hydrogen silsesquioxane (HSQ) film having a thickness of 300 nm was formed as a gate insulating film by spin-coating and hardened by irradiating an optical exposure mercury lamp for 5 minutes. Finally, a gate electrode was formed in the same manner as the source and drain electrode. Thus, a FET using CNT patches was produced. The probability that 100 FETs produced in the above manner correctly operated (at an on/off ratio of at least $10^3$) was 100%. The on-state resistance was $5 \times 10^5 \Omega$ on an average, and the maximum on/off ratio was about $10^5$. The mobility at that time was about 50 cm·V/s$^2$.

Additionally, second FETs in which the formation of the CNT film and the size of the CNT patches were changed were produced by the same production steps as the semiconductor device described above. For the second FETs, the number of spin-coating for forming the CNT film was increased to 40. The width of the CNT patches was 6 μm, the interval between adjacent patches in the same layer was 4 μm, and the overlap width of adjacent patches was 1 μm. The on-state resistance of those FETs was $2.5 \times 10^5 \Omega$, and the mobility was 200 cm·V/s$^2$. The probability that those FETs correctly operated was 100%.

According to the present invention, a channel layer formed of a plurality of CNTs is processed into a plurality of CNT patches perpendicular to the channel direction. Those CNT patches are overlaid to produce a channel layer. The arrangement of the channel layer formed of a plurality of CNT patches perpendicular to the channel direction can increase the probability that part of CNT patches becomes a semiconductive CNT patch in the channel layer. Since part of the channel layer is thus formed of a semiconductive CNT patch, a transistor having a good on/off ratio can be provided. Furthermore, since CNTs are used for the channel layer, the channel layer can be formed by a process at a lower temperature. Thus, according to the present invention, there can be provided a semiconductor device with a transistor having a good on/off ratio and a method of manufacturing the same.

According to the present invention, there is provided a semiconductor device having a source electrode, a drain electrode, and a channel layer provided between the source electrode and the drain electrode, the channel layer being formed by (N+1) carbon nanotube patches (N is a positive integer) each having a size smaller than a channel length in a direction of a channel, the carbon nanotube patches connecting between the source electrode and the drain electrode.

In the semiconductor device according to the present invention, an adjacent carbon nanotube patch may be arranged so as to overlap a carbon nanotube patch of a different layer with an overlap width of 1 µm or less. Furthermore, at least one of the (N+1) carbon nanotube patches may include at least one semiconductive carbon nanotube, and N may be at least 20. Moreover, more than two-thirds, as a theoretical abundance ratio, of the carbon nanotubes forming the patch may be semiconductive carbon nanotubes.

According to the present invention, there is provided a method of manufacturing a semiconductor device, the method including: a step of forming a first carbon nanotube film in which carbon nanotubes are dispersed between a source electrode and a drain electrode on a substrate; a step of cutting the first carbon nanotube film perpendicular to a channel direction to form first carbon nanotube patches; a step of forming a second carbon nanotube film between the source electrode and the drain electrode; and a step of cutting the second carbon nanotube film perpendicular to the channel direction to form second carbon nanotube patches so as to fill a gap between the first carbon nanotube patches and a gap between the source electrode and the drain electrode.

In the method of manufacturing a semiconductor device according to the present invention, the substrate may comprise an insulating material including one of a plastic material, a ceramic material, and a silicon oxide. Furthermore, the carbon nanotubes may be produced by one of a laser abrasion method, an arc discharge method, a chemical vapor deposition method (CVD), and a HiPCO (high-pressure carbon monoxide) method. Moreover, the first and second carbon nanotube films may be produced by one of a method of attaching the carbon nanotubes in a vapor phase and a method of dispersing the carbon nanotubes in a solvent or the like and attaching the carbon nanotubes via a liquid phase.

While the present invention has specifically been described based on the embodiment and examples, the present invention is not limited to the aforementioned embodiment and examples. As a matter of course, various modifications can be made therein without departing from the scope of the present invention, and those modifications should be included in this application.

This application claims the priority of Japanese Patent Application No. 2007-106732, filed Apr. 16, 2007, the disclosure of which is incorporated herein by reference in its entirety.

The invention claimed is:

1. A semiconductor device comprising: a source electrode, a drain electrode, and a channel layer provided between the source electrode and the drain electrode, the channel layer being formed of (N+1) carbon nanotube patches (N is a positive integer) each having a size smaller than a channel length in a direction of a channel, the (N+1) carbon nanotube patches connecting between the source electrode and the drain electrode to thereby form the channel layer,
wherein the (N+1) carbon nanotube patches comprise a first carbon nanotube patch of a first layer and a second carbon nanotube patch of a second layer, the first carbon nanotube patch comprising a plurality of carbon nanotubes and having a first carbon nanotube density, the second carbon nanotube patch comprising a plurality of carbon nanotubes and having a second carbon nanotube density,
a part of the first carbon nanotube patch of the first layer and a part of the second carbon nanotube patch of the second layer being overlapped with each other with an overlap width so as to form an overlap portion and so that the channel layer comprises a remaining part of the first carbon nanotube patch having a first width, a remaining part of the second carbon nanotube patch having a second width, and the overlap portion having the overlap width,
the remaining part of the first carbon nanotube patch having the first carbon nanotube density, the remaining part of the second carbon nanotube patch having the second carbon nanotube density, the overlap portion having a third carbon nanotube density obtained by adding the second carbon nanotube density to the first carbon nanotube density, and each of the first, the second, and the third carbon nanotube densities representing the number of the carbon nanotubes per unit length.

2. The semiconductor device as recited in claim 1, wherein N is at least 20.

3. The semiconductor device as recited in claim 1, wherein more than two-thirds, as a theoretical abundance ratio, of carbon nanotubes forming each carbon nanotube patch of the (N+1) carbon nanotube patches are semiconductive carbon nanotubes.

4. The semiconductor device as claimed in claim 1, wherein the first carbon nanotube patch is obtained by cutting a first carbon nanotube film perpendicular to the direction of the channel, and the second carbon nanotube patch is obtained by cutting a second carbon nanotube film perpendicular to the direction of the channel.

5. The semiconductor device as claimed in claim 1, wherein the overlap width is 1 µm or less.

6. The semiconductor device as claimed in claim 1, wherein the first and the second carbon nanotube patches are of the same quality.

7. The semiconductor device as claimed in claim 1, wherein the third carbon nanotube density falls within the range between 0.016 tubes/µm and 0.033 tubes/µm.

* * * * *